United States Patent [19]

Mitsutsuka

[11] Patent Number: 4,943,751
[45] Date of Patent: Jul. 24, 1990

[54] SURFACE ACOUSTIC WAVE ELEMENT
[75] Inventor: Syuichi Mitsutsuka, Tokyo, Japan
[73] Assignee: Clarion Co., Ltd., Tokyo, Japan
[21] Appl. No.: 368,787
[22] Filed: Jun. 20, 1989
[30] Foreign Application Priority Data
Jun. 28, 1988 [JP] Japan .................. 63-162250
[51] Int. Cl.⁵ .......................................... H04L 41/08
[52] U.S. Cl. ........................ 310/313 D; 310/313 A; 333/153; 333/195
[58] Field of Search .......... 310/313 A, 313 D, 313 R; 333/151, 153, 194, 195

[56] References Cited
U.S. PATENT DOCUMENTS 3,805,195 4/1974 Miller .................. 310/313 A
3,946,338 3/1976 Schmidt ................ 310/313 A
4,013,983 3/1977 Hartmann .............. 310/313 A
4,773,138 9/1988 Ballato et al. ......... 310/313 D

FOREIGN PATENT DOCUMENTS 3048817 9/1981 Fed. Rep. of Germany ...... 333/153

Primary Examiner—Mark O. Budd
Attorney, Agent, or Firm—Wallenstein, Wagner & Hattis

[57] ABSTRACT

In a surface acoustic wave element comprising a semiconductor substrate, a piezoelectric layer formed thereon and at least one interdigital electrode disposed on the surface thereof, a semiconductor region having a conductivity type different from that of the semiconductor substrate is disposed on the outer side of the interdigital electrode just below the piezoelectric layer.

5 Claims, 3 Drawing Sheets

SURFACE ACOUSTIC WAVE ELEMENT

FIELD OF THE INVENTION

This invention relates to a surface acoustic wave (hereinbelow abbreviated to SAW) device used in a convolver used in particular in a spread spectrum communication, an SAW filter, an SAW delay line, etc.

BACKGROUND OF THE INVENTION

In an SAW device, if surface wave is reflected at the end surface of an element, this has influences on the characteristics of the device. For example, in an SAW filter, this causes worsening in the insertion loss of the filter or ripple in the band. In order to prevent the reflection at the end surfaces of the element, heretofore a method was generally adopted, by which sound absorber is located at the neighborhood of the end surfaces. FIG. 6 is a top view of such a device, in which reference numeral 1 is a piezoelectric substrate; 2 indicates interdigital electrodes; and 3 represents sound absorber.

On the other hand, in an SAW device having a piezoelectric thin film/semiconductor substrate) structure, apart from the method, by which the sound absorber is located, it is possible to prevent the reflection of the SAW also by a structure indicated in FIG. 7, in which the reference numerals used in common in FIG. 6 represent items identical or corresponding to those indicated in FIG. 6 and 4 is a semiconductor substrate; 5 is a rear electrode; and 6 indicates metal electrodes.

In the structure indicated in FIG. 7, the SAW passing under the metal electrodes 6 is attenuated by applying a bias voltage $V_B$ between the metal electrode 6 and the rear electrode 5 to convert the surface of the semiconductor substrate and as the result it is possible to prevent the reflection of the SAW at the end surfaces. The structure indicated in FIG. 7 has been already explained in detail in a Japanese patent application entitled "Surface Acoustic Wave Device" (Application No. 59-210566) filed by the same assignee.

However, the method has a drawback that in a small device it is difficult to arrange the sound absorber in a satisfactory manner. Further, it is difficult to keep the position, where the sound absorber is located, the shape and the amount thereof, etc. constant, which gives rise to another drawback that it may be a cause of fluctuations of products.

The structure indicated in FIG. 7 has an advantage that the drawback of the structure indicated in FIG. 6 can be overcome, because it can be fabricated by the photolithographic technique. However, for the structure indicated in FIG. 7, since a bias power source $V_B$ is necessary, in the case where the element is applied to a system, it has a drawback that the number of parts increases in the whole.

OBJECT OF THE INVENTION

The object of this invention is to provide an SAW element in an SAW device having a piezoelectric thin film/semiconductor substrate structure, which can remove the drawbacks described above, and concretely speaking, which has a structure for which no bias power source $V_B$ is necessary.

SUMMARY OF THE INVENTION

In order to achieve the above object, an SAW element according to this invention is characterized in that it comprises a first conductivity type semiconductor substrate, a piezoelectric layer formed on the semiconductor substrate, at least one interdigital electrode disposed on the piezoelectric layer, and a second conductivity type semiconductor region disposed at a position, on a plan view, on the side of the end surface of the substrate, viewed from the interdigital electrode stated above, in the upper surface portion just below the piezoelectric layer.

An insulating layer may be disposed between the semiconductor substrate and the piezoelectric layer stated above.

In an SAW device composed of a semiconductor substrate and a piezoelectric thin film, the reflection at the end surface is prevented by disposing a semiconductor region having a conductivity type opposite to that of the semiconductor substrate 4 in the surface portion thereof, contrarily to the fact that in a prior art structure there is disposed a metal electrode 6 as indicated in FIG. 7.

DETAILED DESCRIPTION

Figure 1A:
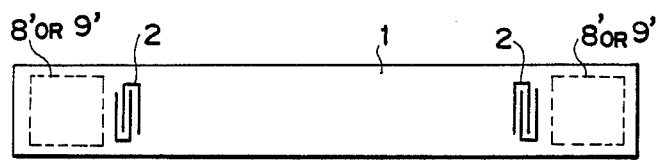
FIG. 1A is a top view of an SAW element according to this invention.
Figure 1B:
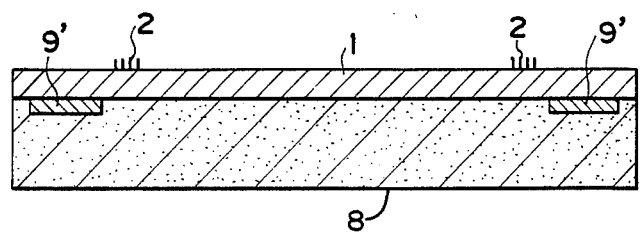
FIGS. 1B and 1C are cross-sectional views thereof.
Figure 1C:
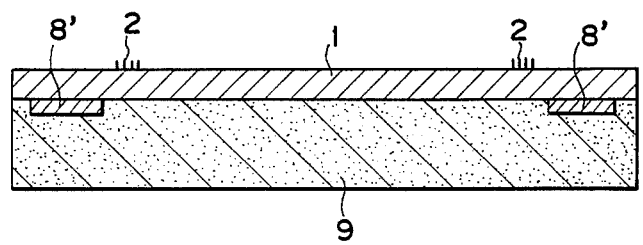

FIG. 1A is a top view of an SAW element according to this invention and FIGS. 1B and 1C are cross-sectional views thereof, in which reference numeral 8 is an n conductivity type semiconductor substrate; 8' is an n conductivity type semiconductor region; 9 is a p conductivity type substrate; and 9' is a p conductivity type semiconductor region.

Figure 2:
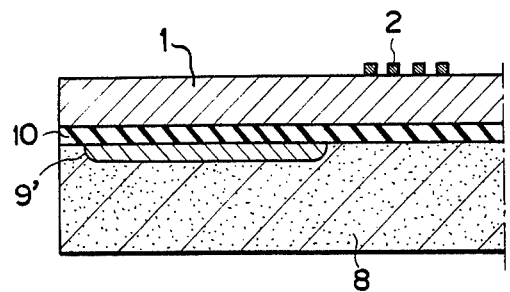
FIG. 2 is a partial cross-sectional view of another SAW element according to this invention.

The cross-sectional view indicated in FIG. 1B shows the construction, in the case where the p conductivity type semiconductor region 9' is formed in the n conductivity type semiconductor substrate 8, while that indicated in FIG. 1C shows the construction, in the case where the n conductivity type semiconductor region 8' is formed in the p conductivity type semiconductor substrate 9. The different conductivity type semiconductor region is located at the middle portion between an interdigital electrode 2 and the end surface of the device, which is opposite thereto. Although the piezoelectric layer/semiconductor structure is shown in FIGS. 1B and 1C, it is also possible to adopt a piezoelectric layer 1/insulator 10/semiconductor 8, 9 structure as indicated in FIG. 2. It can be said that the structure indicated in FIG. 2 is more advantageous than that indicated in FIGS. 1B and 1C, owing to the fact that the number of interfacial energy levels at the surface of the semiconductor is reduced, which stabilizes more satisfactorily characteristics of the element.

Furthermore it is possible also to adopt a piezoelectric layer 1/insulator 10/semiconductor 8, 9/high impurity concentration semiconductor 11 structure. This structure is specifically advantageous in the application to a convolver, etc. owing to the fact that in this case, the propagation loss of the SAW can be reduced in the region other than the part, where there exists the different conductivity type semiconductor region.

Figure 3:
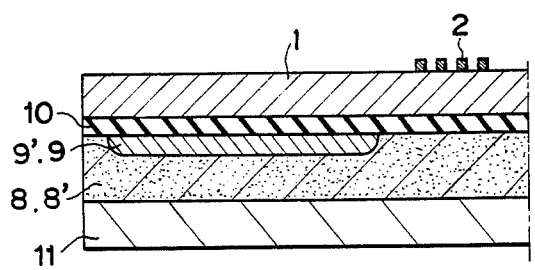
FIG. 3 is a partial cross-sectional view of still another SAW element according to this invention.

For the piezoelectric layer according to this invention, it is possible to use a thin film made of ZnO, AlN, etc.; for the semiconductor Si, GaAs, etc. can be used; and for the insulator in FIGS. 2 and 3 an $SiO_2$ layer, an $SiN_x$ layer can be used. Further the different conductivity type semiconductor region may be formed either by diffusion of the impurity or by ion implantation.

Although no structure is shown between two interdigital electrodes in FIGS. 1A, 1B and 1C indicating the basic structure of this invention, this invention provides an improvement on the structure between the interdigital electrode and the end surface of the element and the structure of the other part is not specifically restricted. That is, between the two electrodes in FIGS. 1A, 1B and 1C, there may be disposed a plurality of strip electrodes, a gate electrode or other interdigital electrodes. Consequently, this invention can be widely applied as means for reducing influences of the reflection of the SAW at the end surface of the element not only in an SAW filter but also an SAW delay line, a matched filter, an SAW convolver, etc.

Now the operation of the embodiment described above will be explained below.

Figure 7:
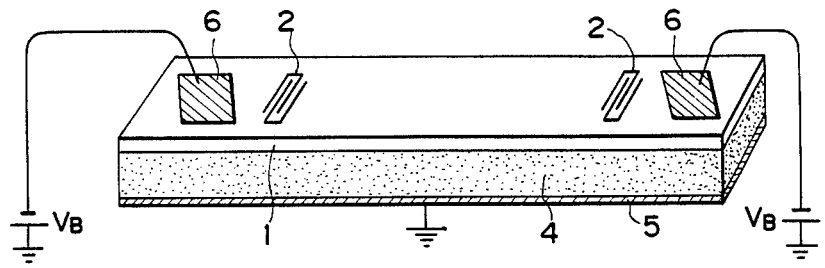
FIG. 7 is a perspective view of another prior art SAW element.

This invention has been done in order to give rise to a phenomenon, which is produced by applying a bias voltage $V_B$ in the prior art structure indicated in FIG. 7, without applying any bias voltage. Hereinbelow it is explained that it is possible. Although the case where a p conductivity type semiconductor region is disposed as the different conductivity semiconductor region in the n conductivity type semiconductor substrate is explained in the following description, for the case where the n conductivity type semiconductor region is disposed in the p conductivity type semiconductor substrate, the element works qualitatively completely identically, if the polarity of the voltage is inverted.

Figure 4:
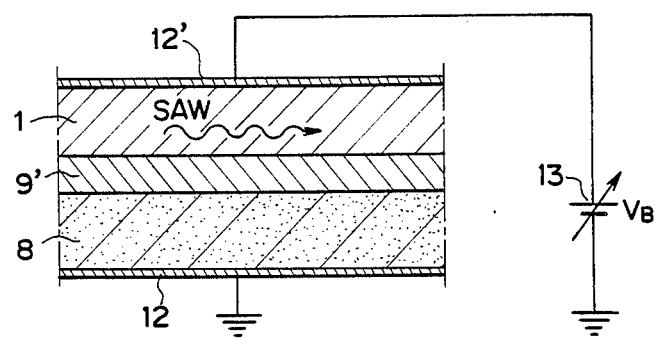
FIG. 4 is a partial cross-sectional view of an SAW element for explaining the principle of this invention.

Now a structure indicated in FIG. 4 is supposed. FIG. 4 shows a structure, where metal electrodes 12 and 12' are formed on the surface of the piezoelectric layer and the rear surface of the semiconductor, respectively, in the part where there exists the different conductivity type semiconductor region according to this invention. This is a structure, in which the different conductivity type semiconductor region is added to the prior art structure indicated in FIG. 7.

Figure 5:
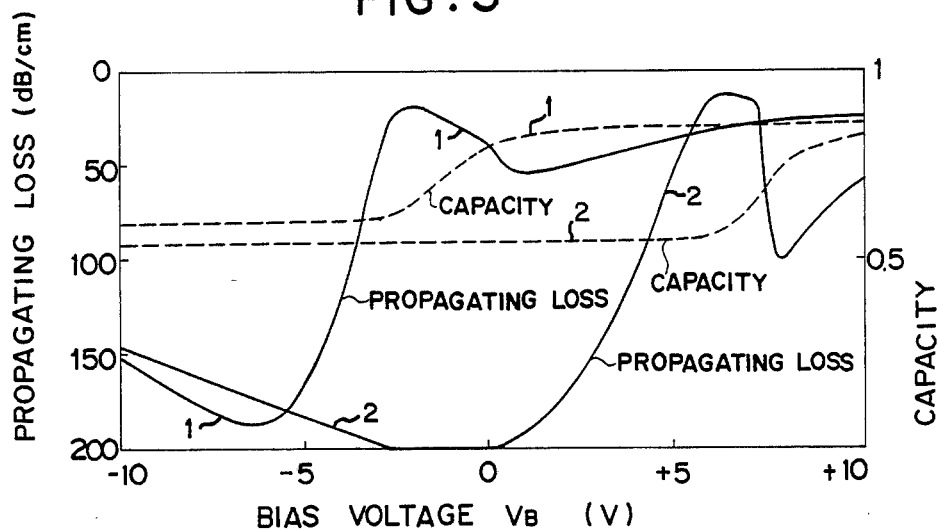
FIG. 5 is a graph for explaining the effect of this invention.
Figure 6:
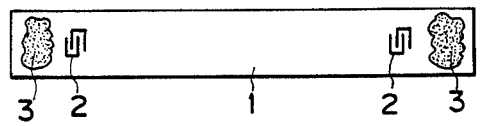
FIG. 6 is a top view of a prior art SAW element.

The propagation loss of the SAW propagating in the structure indicated in FIG. 4 depends on the bias voltage $V_B$ applied between the two electrodes. The relation between $V_B$ and the propagation loss varies, depending on the presence or absence of the p conductivity type semiconductor region, the impurity concentration in each of the semiconductor layers and the thickness thereof. FIG. 5 shows an example of characteristics in the case where the element has a ZnO/Si structure and the propagation mode of the SAW is Sezawa wave. ① in FIG. 5 indicates characteristics in the case where there exists no p conductivity type semiconductor region 9', while ② indicates characteristics in the case where there exists the p conductivity type semiconductor region 9'. ① corresponds to the characteristics obtained for the prior art structure indicated in FIG. 7. The characteristics indicated in FIG. 5 have been obtained by computer simulations, in the case where the donor concentration in the n conductivity type semiconductor 8 is $1 \times 10^{14}$ cm$^{-3}$; the acceptor concentration $N_A$ in the p conductivity type semiconductor region and the thickness thereof $L_A$ are $N_A = 2 \times 10^{15}$ cm$^{-3}$ and $L_A = 0.5$ μm, respectively; and the frequency of the SAW is 215 MHz. Further C-V characteristics (capacity-bias voltage characteristics) are shown by broken lines for comparison in FIG. 5. Examining the C-V characteristics, it can be seen that the propagation loss is very great, when the surface of the semiconductor is in an inverted state for the n conductivity type semiconductor. The object of this invention is to prevent the reflection of the SAW by attenuating the SAW. For this reason, it is necessary to give rise to the inverted state described above. Examining the characteristic curve ① for the prior art structure, it can be seen that in order to realize such a state, it is necessary to apply a negative bias voltage of about several V. Consequently, for the prior art structure a bias power source for applying the bias is inevitable. On the contrary, in the characteristic curve ② in the case where there exists the p conductivity region 9', both the C-V characteristic curve and the propagation loss characteristic curve are shifted towards the positive bias side with respect to those of ①. The amounts of these shifts vary, depending on the of the acceptor concentration $N_A$ by the layer thickness $L_A$ (qualitatively the amounts of the shifts increase with increasing $N_A \times L_A$). When $N_A$ and $L_A$ are so set that the amounts of the shifts are satisfactorily great, it is possible to obtain a very great propagation loss of the SAW, when the bias voltage is 0 as indicated by ② in FIG. 5. In this case, since it is not necessary to apply the bias voltage, no bias power source is required. That is, it is possible to attenuate the SAW without bias power source by disposing a different conductivity type semiconductor region such as a p conductivity type semiconductor in an n conductivity type semiconductor and in this way the reflection of the SAW at the end surface can be prevented. The principle of the operation is same, in the case where the n conductivity type semiconductor region is disposed in the p conductivity type semiconductor. This is the reason why the different conductivity type semiconductor region is disposed according to this invention.

The principle of the operation according to this invention utilizes basically acoustic-electric interaction, and in this meaning, from the point of view of the construction, it is desirable to use a construction having a great electromechanical coupling constant From this point of view, it can be said that a $ZnO/SiO_2/Si$ structure, in which the SAW is a Sezawa wave, is advantageous. In this case, since the electromechanical coupling constant is specifically great, if the face orientation of Si is (110) and the propagation direction of the SAW is [100], the element satisfying this conduction is very advantageous. Further, since the electromechanical coupling constant is fairly great, if the face orientation of Si is (100) and the propagation direction of the SAW is [110], it can be said that this is the next advantageous condition.

This invention can be applied to any SAW device composed of a semiconductor substrate and a piezoelectric thin film. Concretely speaking, it can be applied to an SAW filter, an SAW convolver, a matched filter, a memory correlator, etc.

As explained above, since the structure according to this invention can be realized by process techniques for the usual IC fabrication, the fabrication is easier than by the method, by which sound absorber is disposed, and it is possible to reduce fluctuations in products. Further, since no bias power source is necessary at the drive of the element, it is unnecessary to increase the number of parts around the element and therefore an advantage can be obtained that the structure is useful for the cost reduction.

It is further understood by those skilled in the art that the foregoing description shows preferred embodiments of the disclosed element and that various changes and modifications may be made in the invention without departing from the spirit and scope thereof.

What is claimed is:

1. A surface acoustic wave element comprising:
   a first conductivity type semiconductor substrate;
   a piezoelectric layer formed on said semiconductor substrate;
   at least one interdigital electrode disposed on said piezoelectric layer; and
   a second conductivity type semiconductor region disposed at a position on the side of the end surface of said substrate, viewed from said interdigital electrode, in the upper surface portion just below said piezoelectric layer.

2. A surface acoustic wave element comprising:
   a first conductivity type semiconductor substrate;
   an insulating layer formed on said semiconductor substrate;
   a piezoelectric layer formed on said semiconductor substrate;
   at least one interdigital electrode disposed on said piezoelectric layer; and
   a second conductivity type semiconductor region disposed at a position on the side of the end surface of said substrate, viewed from said interdigital electrode, in the upper surface portion just below said piezoelectric layer.

3. A surface acoustic wave element according to claim 1 wherein said semiconductor substrate has a semiconductor/high impurity concentration semiconductor structure.

4. A surface acoustic wave element according to claim 1 or 2 wherein the mode of the surface acoustic wave is Sezawa wave; the semiconductor is Si; the face orientation of Si is (110); and the propagation direction is [100].

5. A surface acoustic wave element according to claim 1 or 2 wherein the mode of the surface acoustic wave is Sezawa wave; the semiconductor is Si; the face orientation of Si is (100); and the propagation direction is [110].

* * * * *